US012787153B2

(12) United States Patent
Yeh

(10) Patent No.: US 12,787,153 B2
(45) Date of Patent: Nov. 3, 2026

(54) HEAT DISSIPATION STRUCTURE

(71) Applicant: Wistron NeWeb Corporation, Hsinchu (TW)

(72) Inventor: Chieh Yeh, Hsinchu (TW)

(73) Assignee: WISTRON NEWEB CORPORATION, Hsinchu (TW)

( * ) Notice: Subject to any disclaimer, the term of this patent is extended or adjusted under 35 U.S.C. 154(b) by 244 days.

(21) Appl. No.: 18/736,949

(22) Filed: Jun. 7, 2024

(65) Prior Publication Data

US 2025/0133651 A1 Apr. 24, 2025

(30) Foreign Application Priority Data

Oct. 23, 2023 (TW) ................................ 112140416

(51) Int. Cl.
*H05K 1/02* (2006.01)

(52) U.S. Cl.
CPC .................................. *H05K 1/021* (2013.01)

(58) Field of Classification Search
CPC .. H05K 7/20445; H05K 1/0203; H05K 1/021; H05K 1/0209; H05K 2201/066; H05K 7/20409; H05K 7/20418; H05K 7/20436; H05K 7/2049; H05K 7/20854; H10W 40/641; H10W 40/70; H10W 40/228
See application file for complete search history.

(56) References Cited

U.S. PATENT DOCUMENTS

RE35,721 E * 2/1998 Daikoku ............ H10W 40/774 361/719
2019/0231312 A1* 8/2019 Fife ..................... A61B 8/4483

FOREIGN PATENT DOCUMENTS

CN 203934232 U 11/2014
JP 2004241553 A 8/2004

OTHER PUBLICATIONS

Ogiso Haruhiko, JP-2004241553-A, Heat-Radiating Structure of Electronic Component, 2004, PE2E search Translation (Year: 2004).*
(Continued)

*Primary Examiner* — Michael A Matey
(74) *Attorney, Agent, or Firm* — McClure, Qualey & Rodack, LLP

(57) ABSTRACT

A heat dissipation structure including a circuit board, a heat component, a metal component, a heat dissipation medium, and a heat sink is proposed. The heat component is connected to one side of the circuit board. The metal component is connected to another side of the circuit board and has a first concave-convex surface. The heat dissipation medium is connected to the metal component. The heat sink is connected to the heat dissipation medium and has a second concave-convex surface. The heat component, the circuit board, the metal component, the heat dissipation medium, and the heat sink are connected in sequence. The shape of the first concave-convex surface corresponds to the shape of the second concave-convex surface. One side of the heat dissipation medium is connected to the first concave-convex surface, and another side of the heat dissipation medium is connected to the second concave-convex surface.

10 Claims, 9 Drawing Sheets

(56) References Cited

OTHER PUBLICATIONS

Akasaki Hiroshi, JP-H065750-A, Cooling Mechanism for Semiconductor Element, 1994, PE2E search Translation (Year: 1994).*
Isoda, Yohei et al., WO 2014132399 A1, Heat Dissipating Structure, 2014, PE2E search Translation (Year: 2014).*

* cited by examiner

HEAT DISSIPATION STRUCTURE

RELATED APPLICATIONS

This application claims the benefit of priority to Taiwan Patent Application Serial No. 112140416, filed on Oct. 23, 2023. The entire content of the above identified application is incorporated herein by reference.

BACKGROUND

Technical Field

The present disclosure relates to a heat dissipation structure, in particular to a heat dissipation structure for a circuit board.

Description of Related Art

Regarding the heat dissipation of electronic products, a commonly employed method involves transferring heat from the surface of an internal heat component to a heat sink through a thermal interface material (TIM) via thermal conduction, thereby effectively reducing the temperature of the components. However, there may also be other factors such as electromagnetic interference that prevent the upper surface of the heat component from contacting the heat sink. In such scenarios, for the heat component attached to the circuit board, if the position of the heat sink is on the opposite side of the circuit board to utilize thermal interface material to establish contact with the circuit board, due to the limited area of the circuit board and constraints related to the layout of electronic components, this approach may result in insufficient contact areas "between the thermal interface material and the circuit board" as well as "between the thermal interface material and the heat sink." These limitations can lead to suboptimal heat dissipation efficiency. Consequently, a need exists in the current market for a heat dissipation structure that can effectively enhance heat dissipation efficiency within the constraints of limited circuit board space.

SUMMARY

An object of the present disclosure is to provide a heat dissipation structure. Through the concave-convex three-dimensional structure between the metal component and the heat sink, combined with the heat dissipation medium, the contact area between each other can be greatly increased to solve the problem of unsatisfied heat dissipation performance due to too small contact area of conventional heat dissipation structures.

According to an embodiment of structural configuration in the present disclosure, a heat dissipation structure including a circuit board, a heat component, a metal component, a heat dissipation medium, and a heat sink is provided. The heat component is connected to one side of the circuit board. The metal component is connected to another side of the circuit board and has a first concave-convex surface. The heat dissipation medium is connected to the metal component. The heat sink is connected to the heat dissipation medium and has a second concave-convex surface. The heat component, the circuit board, the metal component, the heat dissipation medium, and the heat sink are connected in sequence. A shape of the first concave-convex surface corresponds to a shape of the second concave-convex shape. One side of the heat dissipation medium is connected to the first concave-convex surface, and another side of the heat dissipation medium is connected to the second concave-convex surface.

According to another embodiment of structural configuration in the present disclosure, a heat dissipation structure including a circuit board, a heat component, a metal component, a heat dissipation medium, and a heat sink is provided. The heat component is connected to one side of the circuit board. The metal component is connected to another side of the circuit board and has a first surface. The heat dissipation medium is connected to the metal component. The heat sink is connected to the heat dissipation medium and has a second surface. The heat component, the circuit board, the heat dissipation medium, and the heat sink are connected in sequence. A shape of the first surface corresponds to a shape of the second surface. One side of the heat dissipation medium is connected to the first surface. Another side of the heat dissipation medium is connected to the second surface. A surface area of the first surface is greater than a projected area of the metal component projected on the circuit board along a direction.

BRIEF DESCRIPTION OF THE DRAWINGS

The present disclosure can be more fully understood by reading the following detailed description of the embodiment, with reference made to the accompanying drawings as follows.

DETAILED DESCRIPTION

Figure 1:
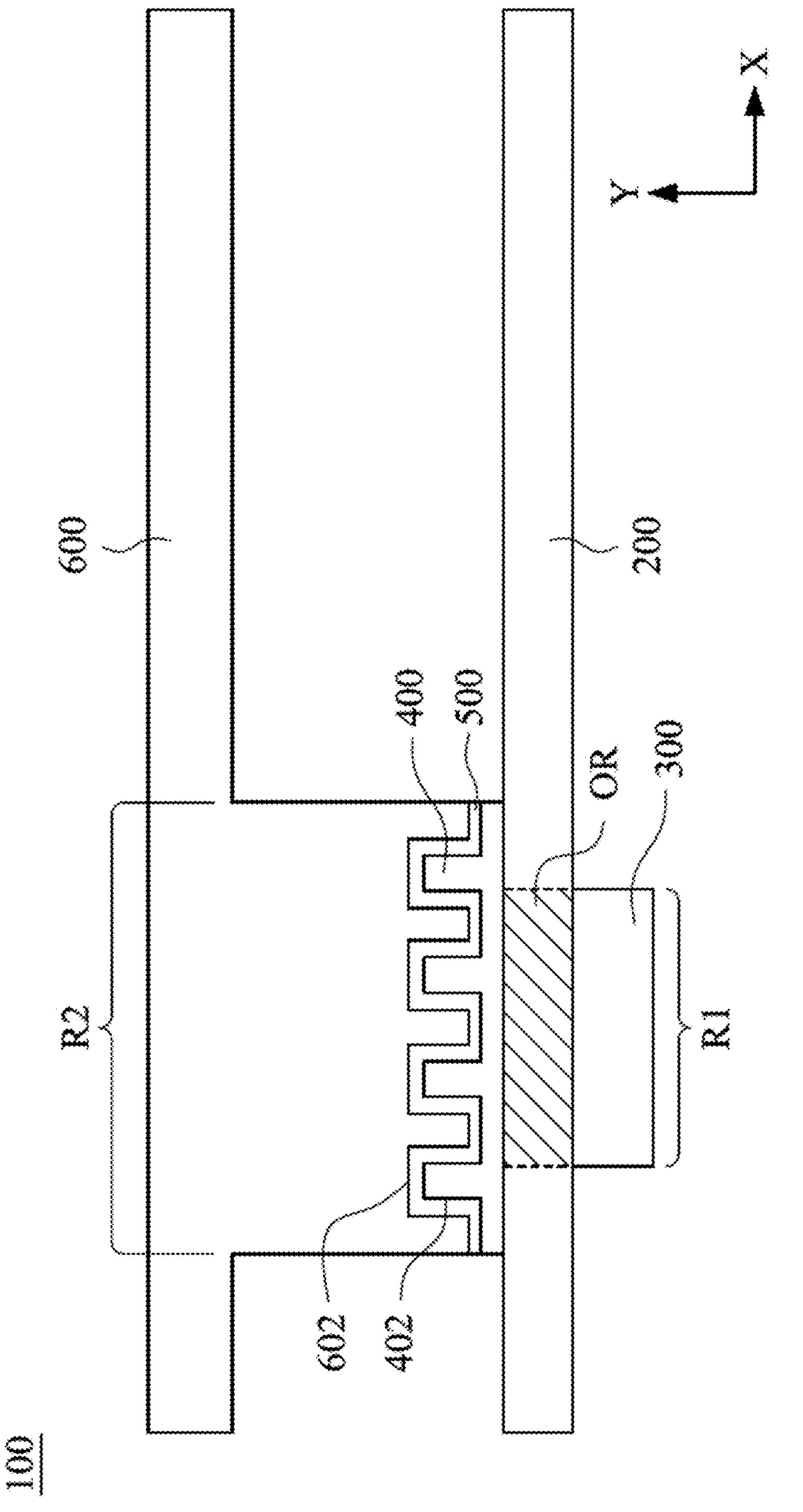
FIG. 1 is a schematic view of a heat dissipation structure according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as “first,” “second” or “third” can be used to describe various components, signals or the like, which are for distinguishing one component/signal from another one only, and are not intended to, nor should be construed to impose any substantive limitations on the components, signals or the like.

Figure 2A:
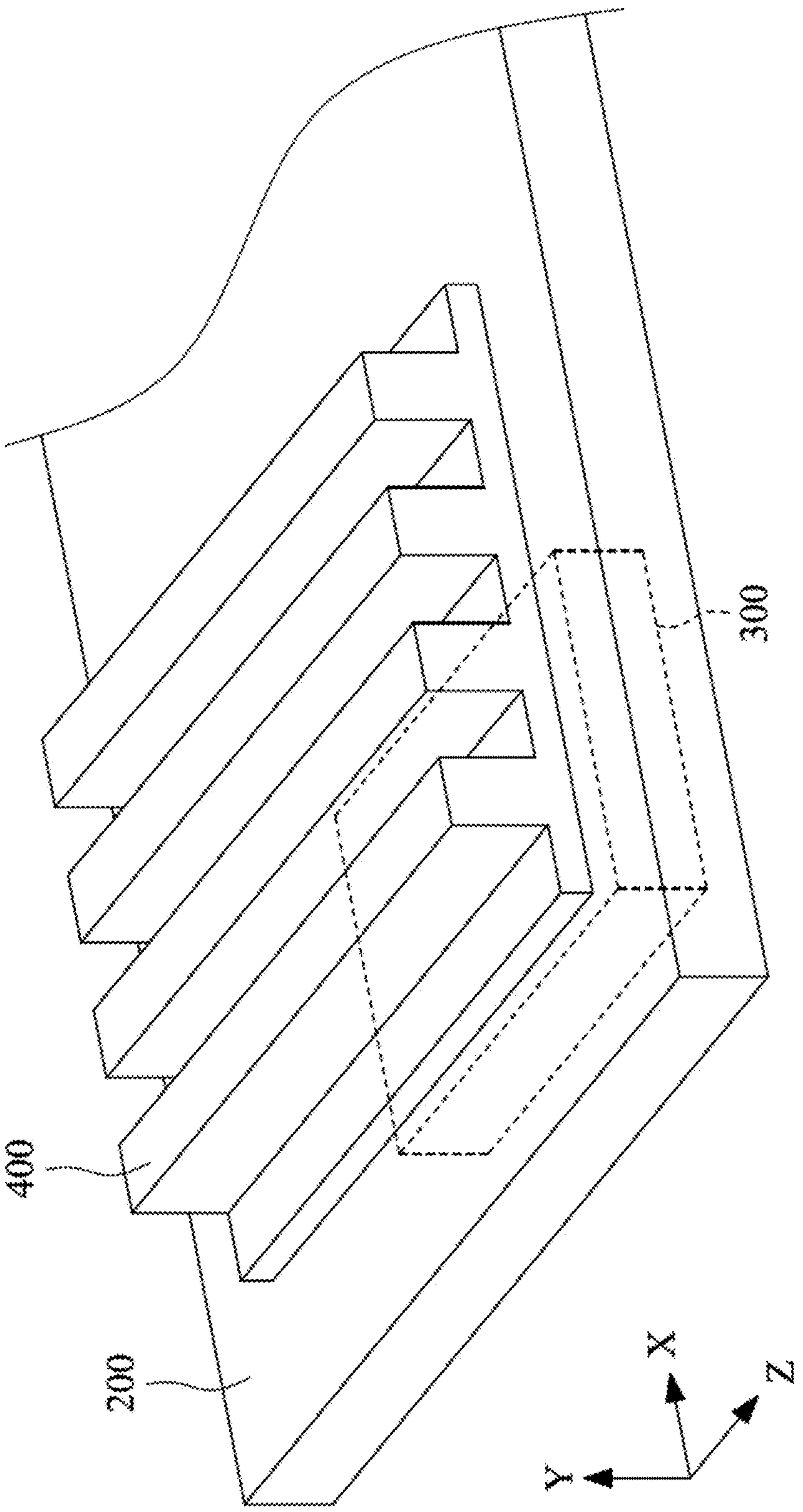
FIG. 2A is a perspective view of a circuit board, a heat component, and a metal component of the heat dissipation structure as shown in FIG. 1.
Figure 2B:
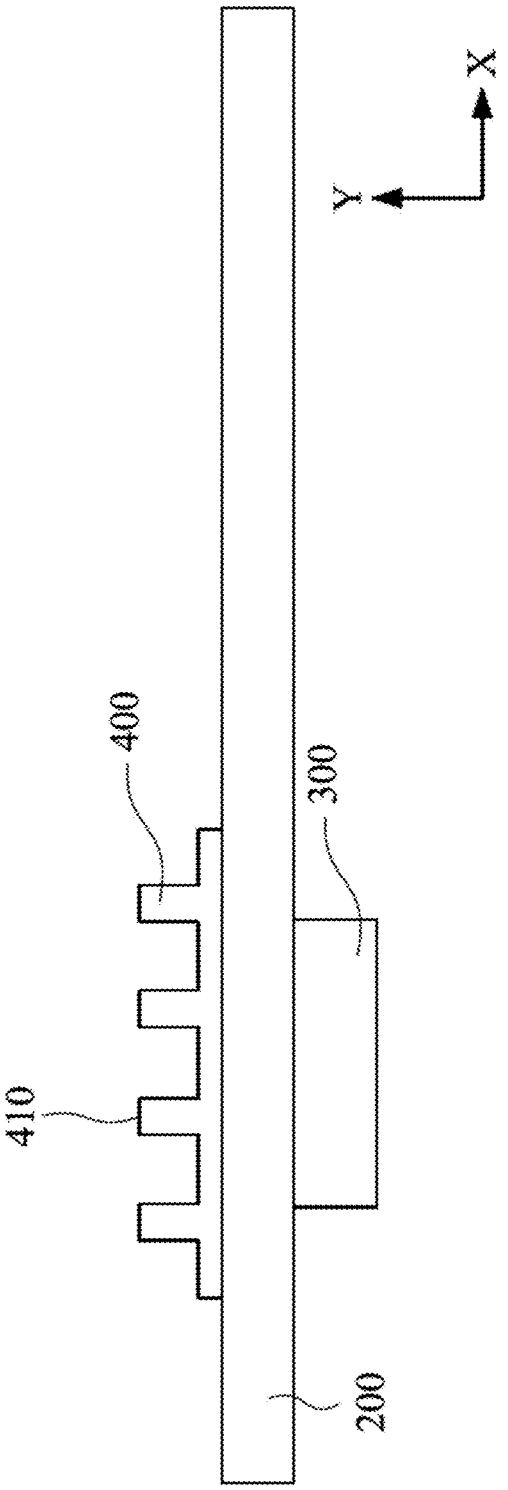
FIG. 2B is a side view of the circuit board, the heat component, and the metal component as shown in FIG. 2A.
Figure 2C:
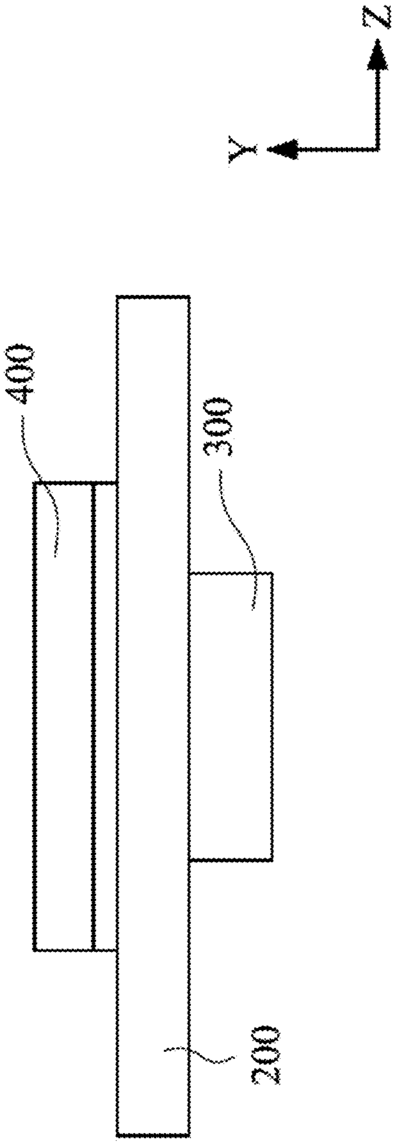
FIG. 2C is another side view of the circuit board, the heat component, and the metal component as shown in FIG. 2A.

Referring to FIG. 1, FIG. 2A, FIG. 2B, and FIG. 2C. FIG. 1 is a schematic view (side view) of a heat dissipation structure 100 according to a first embodiment of the present disclosure. FIG. 2A is a perspective view of a circuit board 200, a heat component 300, and a metal component 400 of the heat dissipation structure 100 as shown in FIG. 1. FIG. 2B is a side view (plan view in directions X and Y) of the circuit board 200, the heat component 300, and the metal component 400 as shown in FIG. 2A. FIG. 2C is another side view (plan view in directions Y and Z) of the circuit board 200, the heat component 300, and the metal component 400 as shown in FIG. 2A. The heat dissipation structure 100 includes a circuit board 200, a heat component 300, a metal component 400, a heat dissipation medium 500, and a heat sink 600. The heat component 300 is connected to one side of the circuit board 200. The metal component 400 is connected to another side of the circuit board 200 and has a first concave-convex surface 402. The heat dissipation medium 500 is connected to the metal component 400. The heat sink 600 is connected to the heat dissipation medium 500 and has a second concave-convex surface 602. The heat component 300, the circuit board 200, the metal component 400, the heat dissipation medium 500, and the heat sink 600 are connected in sequence. The shape of the first concave-convex surface 402 corresponds to the shape of the second concave-convex surface 602. One side of the heat dissipation medium 500 is connected to the first concave-convex surface 402. Another side of the heat dissipation medium 500 is connected to the second concave-convex surface 602.

Specifically, the projection of the heat component 300 along a direction Y on one side of the circuit board 200 forms a first projection region R1. The projection of the metal component 400 along the direction Y on another side of the circuit board 200 forms a second projection region R2. The first projection region R1 and the second projection region R2 are partially overlapped along the direction Y. In the present embodiment, the first projection region R1 and part of the second projection region R2 are overlapped along the direction Y (e.g., an overlapped region OR). The area of the first projection region R1 is smaller than the area of the second projection region R2. In addition, the metal component 400 is attached to the circuit board 200 by a surface-mount technology (SMT). The shape of the heat dissipation medium 500 corresponds to the shape of the first concave-convex surface 402 and the shape of the second concave-convex surface 602. In other words, the heat dissipation medium 500 is in a concave-convex shape. The heat dissipation medium 500 can be thermal jelly. The distance between the metal component 400 and the heat sink 600 should take into account the manufacturing dimensional tolerances of the two and the assembly tolerances of the system. On the premise that component interference does not occur to affect the assembly, the distance between the two should be minimized as much as possible to reduce the thickness of the heat dissipation medium 500 and reduce the thermal impedance of the heat conduction path.

In other embodiments, the area of the first projection region can be greater than the area of the second projection region. The heat dissipation medium can be other types of thermal interface materials (TIM), depending on the application requirements, and the present disclosure is not limited thereto.

Therefore, the heat dissipation structure 100 of the present disclosure uses a concave-convex three-dimensional structure that matches between the metal component 400 and the heat sink 600, and fills the concave-convex three-dimensional structure with the heat dissipation medium 500, so as to increase the contact area between the heat dissipation medium 500 and the metal component 400, and the contact area between the heat dissipation medium 500 and the heat sink 600. Thus, the effects of reducing thermal resistance and enhancing heat dissipation are achieved.

Figure 3:
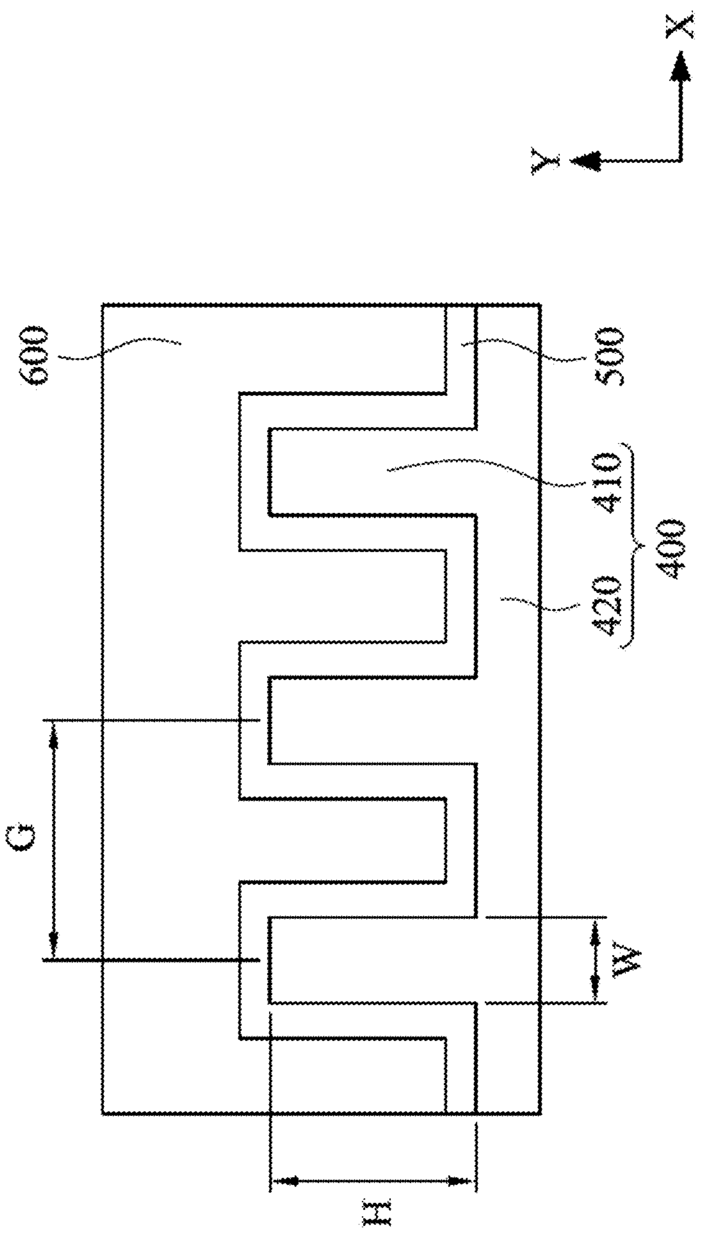
FIG. 3 is a partial schematic view of the metal component, a heat dissipation medium, and a heat sink of the heat dissipation structure as shown in FIG. 1.

Referring to FIG. 1 and FIG. 3. FIG. 3 is a partial schematic view of the metal component 400, the heat dissipation medium 500, and the heat sink 600 of the heat dissipation structure 100 as shown in FIG. 1. The metal component 400 includes at least one convex portion 410 and a connecting portion 420. The convex portion 410 is connected to the heat dissipation medium 500 and has a height H (along the direction Y) and a convex shape. The height H can be greater than or equal to 1 mm, and smaller than or equal to 20% of the square root of the projected area of the metal component 400 projected on the circuit board 200 along the direction Y. The shape of the convex shape is a rectangle. The aforementioned height H being greater than or equal to 1 mm can significantly improve the heat dissipation effect, and the restriction that the height H is smaller than or equal to 20% of the square root of the projected area allows the heat dissipation medium 500 to be totally filled between the metal component 400 and the heat sink 600. In addition, the connecting portion 420 is connected to the convex portion 410 and the heat dissipation medium 500. A connection part of the connecting portion 420 and the convex portion 410 has a width W (along the direction X). The width W is greater than or equal to 0.5 times the height H, and smaller than or equal to 6 times the height H, so as to have a better heat dissipation effect. The number of the convex portion is plural. An interval G is between adjacent two of the convex portions 410 (the distance between two centers of two adjacent convex portions 410 along the direction X). The interval G is greater than or equal to the height H, and smaller than or equal to 6 times the height H, so as to have a better heat dissipation effect. In other embodiments, there may be only one convex portion 410.

Figure 4:
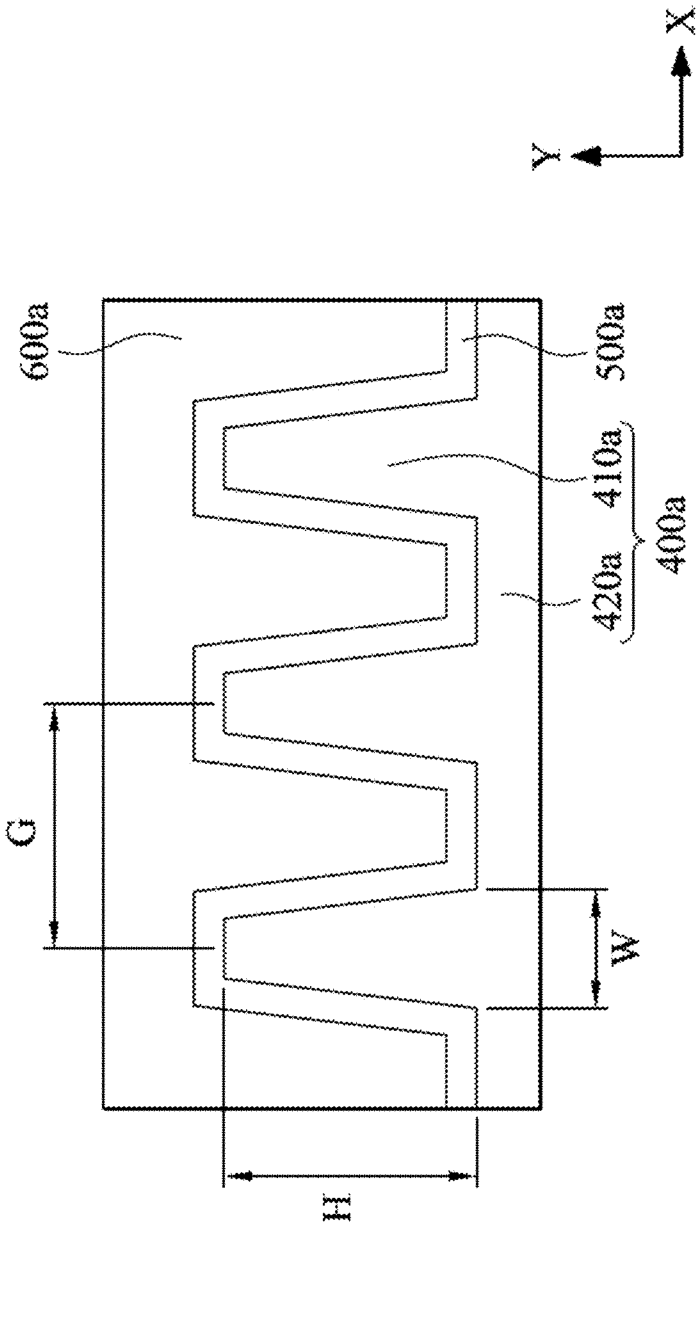
FIG. 4 is a partial schematic view of a metal component, a heat dissipation medium, and a heat sink of a heat dissipation structure according to a second embodiment of the present disclosure.
Figure 5:
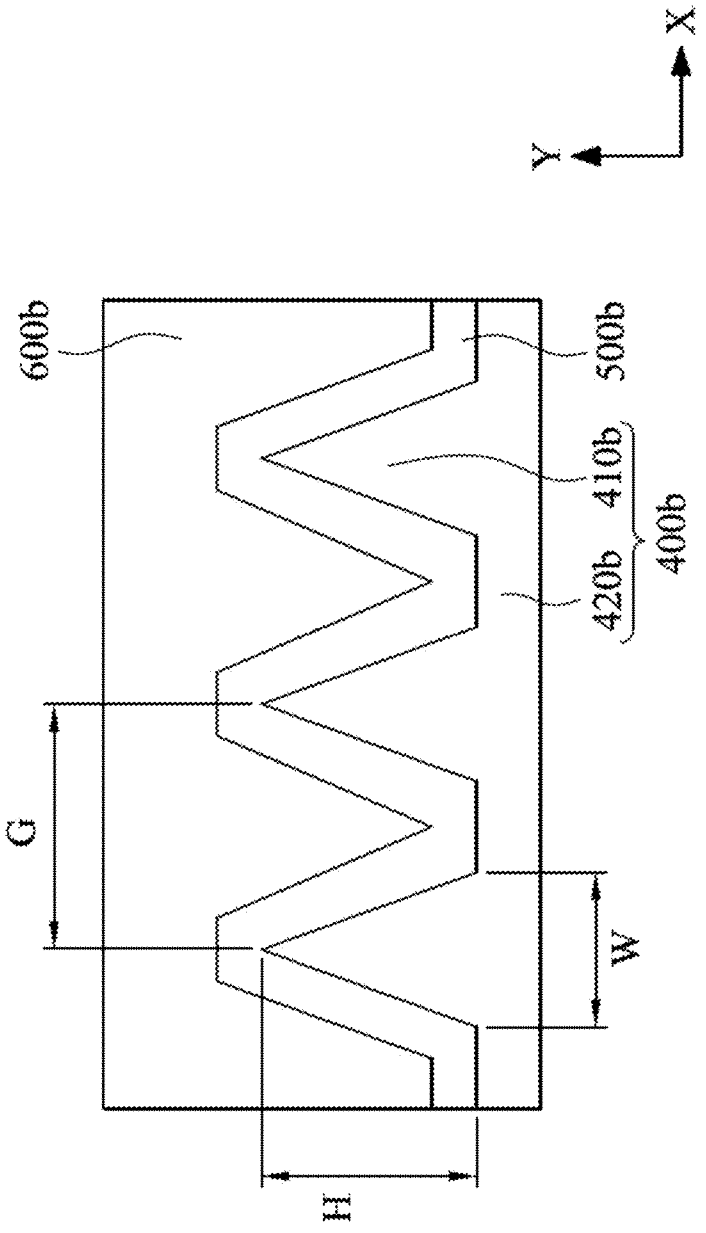
FIG. 5 is a partial schematic view of a metal component, a heat dissipation medium, and a heat sink of a heat dissipation structure according to a third embodiment of the present disclosure.

Referring to FIG. 3, FIG. 4, and FIG. 5. FIG. 4 is a partial schematic view of a metal component 400*a*, a heat dissipation medium 500*a*, and a heat sink 600*a* of a heat dissipation structure according to a second embodiment of the present disclosure. FIG. 5 is a partial schematic view of a metal component 400*b*, a heat dissipation medium 500*b*, and a heat sink 600*b* of a heat dissipation structure according to a third embodiment of the present disclosure. The metal component 400*a* includes at least one convex portion 410*a* and a connecting portion 420*a*. The convex shape of the convex portion 410*a* is a trapezoid. The shape of the heat dissipation medium 500*a* and the shape of the heat sink 600*a* both correspond to the convex shape of the convex portion 410*a*. In addition, the metal component 400*b* includes at least one convex portion 410*b* and a connecting portion 420*b*. The convex shape of the convex portion 410*b* is a triangle. The shape of the heat dissipation medium 500*b* and the shape of the heat sink 600*b* both correspond to the convex shape of the convex portion 410*b*. In other embodiments, the convex shape can be an arc or other non-planar shape, and the present disclosure does not limit thereto. Therefore, the heat dissipation structure of the present disclosure can utilize various convex shapes to increase the contact area, all of which can enhance the heat dissipation effect.

Figure 6:
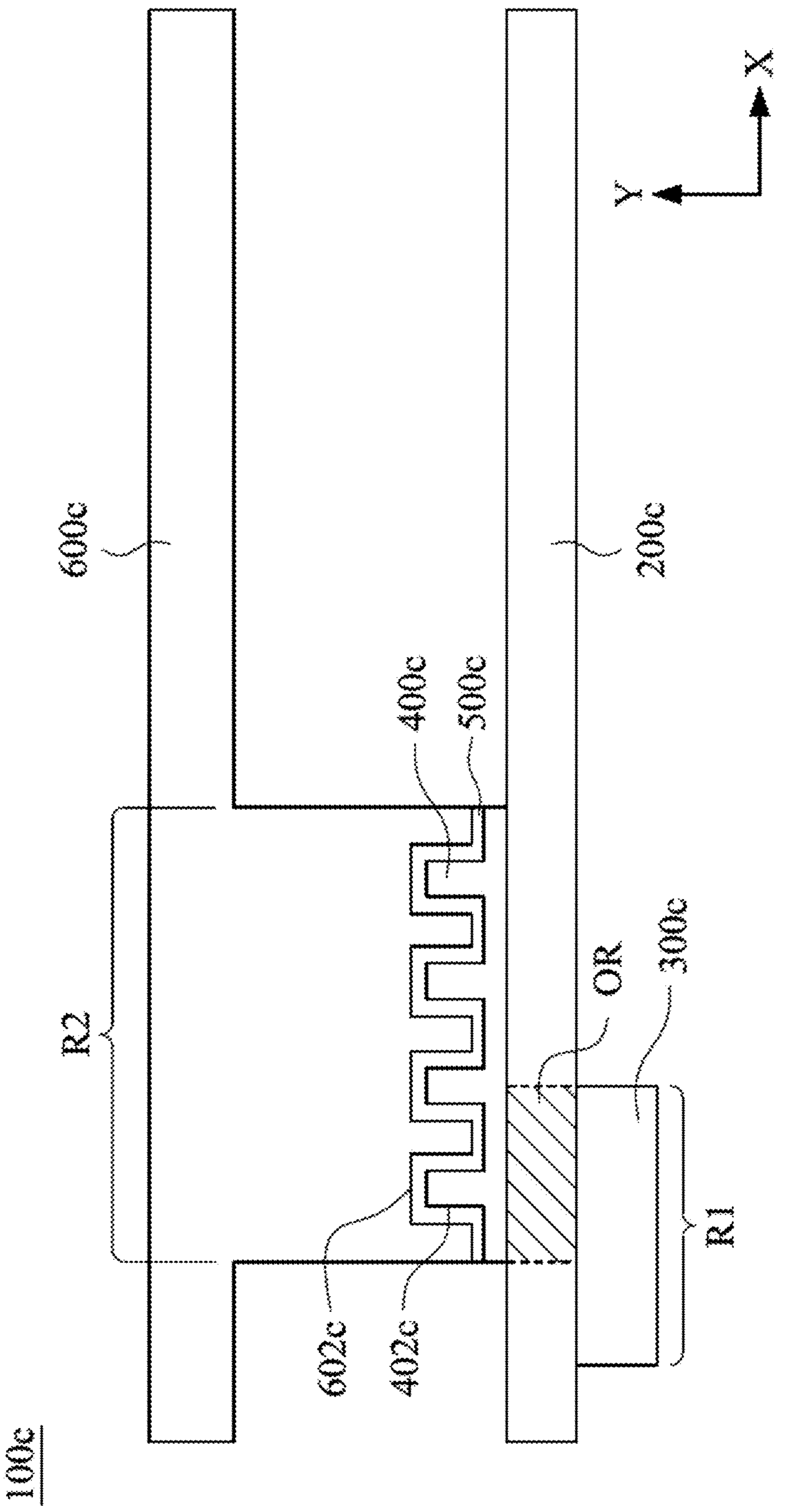
FIG. 6 is a schematic view of a heat dissipation structure according to a fourth embodiment of the present disclosure.

Referring to FIG. 1 and FIG. 6. FIG. 6 is a schematic view of a heat dissipation structure 100*c* according to a fourth embodiment of the present disclosure. The heat dissipation structure 100*c* includes a circuit board 200*c*, a heat component 300*c*, a metal component 400*c*, a heat dissipation medium 500*c*, and a heat sink 600*c*. The heat component 300*c* is connected to one side of the circuit board 200*c*. The metal component 400*c* is connected to another side of the circuit board 200*c* and has a first surface 402*c*. The heat dissipation medium 500*c* is connected to the metal component 400*c*. The heat sink 600*c* is connected to the heat dissipation medium 500*c* and has a second surface 602*c*. The heat component 300*c*, the circuit board 200*c*, the metal component 400*c*, the heat dissipation medium 500*c*, and the heat sink 600*c* are connected in sequence. The shape of the first surface 402*c* corresponds to the shape of the second surface 602*c*. One side of the heat dissipation medium 500*c* is connected to the first surface 402*c*. Another side of the heat dissipation medium 500*c* is connected to the second surface 602*c*. The surface area of the first surface 402*c* is greater than a projected area of the metal component 400*c* projected on the circuit board 200*c* along a direction Y. The difference between the heat dissipation structure 100 as shown in FIG. 1 and the heat dissipation structure 100*c* as shown in FIG. 6 is that the position of the heat component 300 relative to the circuit board 200 as shown in FIG. 1 is different from the position of the heat component 300*c* relative to the circuit board 200*c* as shown in FIG. 6. Part of the first projection region R1 and part of the second projection region R2 are overlapped along the direction Y (e.g., an overlapped region OR). Therefore, the heat dissipation structure 100*c* of the present disclosure can also exert a certain heat dissipation effect under the condition of partial projection overlap.

Figure 7:
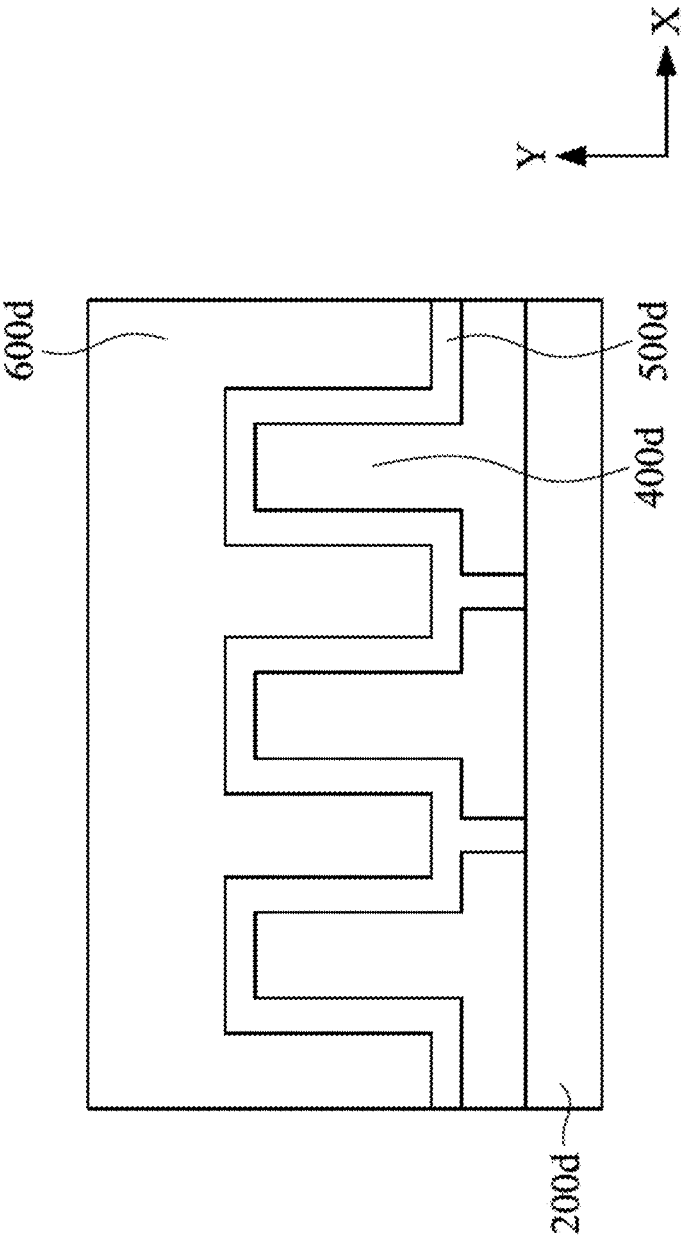
FIG. 7 is a partial schematic view of a circuit board, a metal component, a heat dissipation medium, and a heat sink of a heat dissipation structure according to a fifth embodiment of the present disclosure.

Referring to FIG. 3 and FIG. 7. FIG. 7 is a partial schematic view of a circuit board 200*d*, a metal component 400*d*, a heat dissipation medium 500*d*, and a heat sink 600*d* of a heat dissipation structure according to a fifth embodiment of the present disclosure. The metal component 400*d* is connected between the circuit board 200*d* and the heat dissipation medium 500*d*. One side of the heat dissipation medium 500*d* is connected to the circuit board 200*d* or the metal component 400*d*. Another side of the heat dissipation medium 500*d* is connected to the heat sink 600*d*. In other words, compared to the metal component 400 as shown in FIG. 3, the metal component 400*d* as shown in FIG. 7 can be a segmented, holed or hollow structure, so that the metal component 400*d* does not occupy the entire projected area. The unoccupied area is filled by the heat dissipation medium 500*d*, so that the heat dissipation medium 500*d* is in contact with the circuit board 200*d*. Therefore, the present disclosure can also exert a certain heat dissipation effect by using the metal component 400*d* with grooves or through holes.

In other embodiments, the heat dissipation structure may include a circuit board, multiple heat components, multiple metal components, and multiple heat dissipation mediums. The multiple heat components are respectively disposed on different positions of the circuit board. The multiple heat dissipation mediums can be correspondingly connected to one or more heat sinks. Depending on the application requirements, the present disclosure is not limited to the above.

From the above embodiments, the present disclosure has the following advantages. First, the heat dissipation structure uses a concave-convex three-dimensional structure that matches between the metal component and the heat sink, and fills the concave-convex three-dimensional structure with the heat dissipation medium, so as to increase the contact area between the heat dissipation medium and the metal component, and the contact area between the heat dissipation medium and the heat sink. Thus, the effects of reducing thermal resistance and enhancing heat dissipation are achieved. Second, the heat dissipation structure can use various convex shapes to increase the contact area, all of which can enhance the heat dissipation effect.

The foregoing description of the disclosure has been presented only for the purposes of illustration and description option of the exemplary embodiments and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A heat dissipation structure, comprising:

a circuit board;

a heat component connected to one side of the circuit board;

a metal component connected to another side of the circuit board and having a first concave-convex surface;

a heat dissipation medium connected to the metal component; and a heat sink connected to the heat dissipation medium and having a second concave-convex surface;

wherein the heat component, the circuit board, the metal component, the heat dissipation medium, and the heat sink are connected in sequence, a shape of the first concave-convex surface corresponds to a shape of the second concave-convex surface, one side of the heat dissipation medium is connected to the first concave-convex surface, and another side of the heat dissipation medium is connected to the second concave-convex surface;

wherein the metal component comprises:

at least one convex portion connected to the heat dissipation medium and having a height, the height being greater than or equal to 1 mm, and smaller than or equal to 20% of a square root of a projected area of the metal component projected on the circuit board along a direction.

2. The heat dissipation structure according to claim 1, wherein a projection of the heat component along a direction on the one side of the circuit board forms a first projection region, a projection of the metal component along the direction on the another side of the circuit board forms a second projection region, and the first projection region and the second projection region are partially overlapped along the direction.

3. The heat dissipation structure according to claim 1, wherein the metal component is attached to the circuit board by a surface-mount technology (SMT), and a shape of the heat dissipation medium corresponds to the shape of the first concave-convex surface and the shape of the second concave-convex surface.

4. The heat dissipation structure according to claim 1, wherein the at least one convex portion further has a convex shape, and the convex shape is a rectangle, a trapezoid, a triangle, or an arc.

5. The heat dissipation structure according to claim 1, wherein the metal component further comprises:

a connecting portion connected between the at least one convex portion and the circuit board, wherein a connection part of the connecting portion and the at least one convex portion has a width, and the width is greater than or equal to 0.5 times the height, and smaller than or equal to 6 times the height;

wherein a number of the at least one convex portion is plural, an interval is between adjacent two of the convex portions, and the interval is greater than or equal to the height, and smaller than or equal to 6 times the height.

6. A heat dissipation structure, comprising:

a circuit board;

a heat component connected to one side of the circuit board;

a metal component connected to another side of the circuit board and having a first surface;

a heat dissipation medium connected to the metal component; and a heat sink connected to the heat dissipation medium and having a second surface;

wherein the heat component, the circuit board, the metal component, the heat dissipation medium, and the heat sink are connected in sequence, a shape of the first surface corresponds to a shape of the second surface, one side of the heat dissipation medium is connected to the first surface, another side of the heat dissipation medium is connected to the second surface, and a surface area of the first surface is greater than a projected area of the metal component projected on the circuit board along a direction;

wherein the metal component comprises:

at least one convex portion connected to the heat dissipation medium and having a height, the height being greater than or equal to 1 mm, and smaller than or equal to 20% of a square root of the projected area.

7. The heat dissipation structure according to claim 6, wherein a projection of the heat component along the direction on the side of the circuit board forms a first projection region, a projection of the metal component along the direction on the another side of the circuit board forms a second projection region, and the first projection region and the second projection region are partially overlapped along the direction.

8. The heat dissipation structure according to claim 6, wherein the metal component is attached to the circuit board by a surface-mount technology (SMT), and a shape of the heat dissipation medium corresponds to the shape of the first surface and the shape of the second surface.

9. The heat dissipation structure according to claim 6, wherein the at least one convex portion further has a convex shape, and the convex shape is a rectangle, a trapezoid, a triangle, or an arc.

10. The heat dissipation structure according to claim 6, wherein the metal component further comprises:

a connecting portion connected between the at least one convex portion and the circuit board, wherein a connection part of the connecting portion and the at least one convex portion has a width, and the width is greater than or equal to 0.5 times the height, and smaller than or equal to 6 times the height;

wherein a number of the at least one convex portion is plural, an interval is between adjacent two of the convex portions, and the interval is greater than or equal to the height, and smaller than or equal to 6 times the height.

* * * * *